US012782386B2

(12) United States Patent
Chin et al.

(10) Patent No.: US 12,782,386 B2
(45) Date of Patent: Nov. 3, 2026

(54) METHOD OF FORMING A PLURALITY OF CONDUCTIVE INTERCONNECT STRUCTURES FOR CIRCUIT PROBE TESTING OF AN INTEGRATED CIRCUIT STRUCTURE

(71) Applicant: Taiwan Semiconductor Manufacturing Company, Ltd., Hsinchu (TW)

(72) Inventors: Shu-Cheng Chin, Hsinchu (TW); Kong-Beng Thei, Pao-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 422 days.

(21) Appl. No.: 18/459,565

(22) Filed: Sep. 1, 2023

(65) Prior Publication Data

US 2025/0076340 A1 Mar. 6, 2025

(51) Int. Cl.

| | |
|---|---|
| ***H10W 20/42*** | (2026.01) |
| ***G01R 1/04*** | (2006.01) |
| ***H10P 50/28*** | (2026.01) |
| ***H10W 20/00*** | (2026.01) |
| ***H10W 70/685*** | (2026.01) |
| ***H10W 90/00*** | (2026.01) |

(52) U.S. Cl.
CPC ............ *G01R 1/0416* (2013.01); *H10P 50/28* (2026.01); *H10W 20/069* (2026.01); *H10W 20/42* (2026.01); *H10W 70/685* (2026.01); *H10W 90/701* (2026.01)

(58) Field of Classification Search
CPC ... G01R 1/0416; G01R 31/2851; H10P 50/28; H10P 74/273; H10P 74/207; H10W 20/069; H10W 20/42; H10W 70/685; H10W 90/701
See application file for complete search history.

(56) References Cited

U.S. PATENT DOCUMENTS

| | | | | |
|---|---|---|---|---|
| 2018/0057356 | A1* | 3/2018 | Tedeschi | B81B 7/0058 |
| 2018/0122718 | A1* | 5/2018 | Hisaka | H10D 30/87 |
| 2019/0164867 | A1* | 5/2019 | Hu | H10P 74/273 |
| 2019/0206893 | A1* | 7/2019 | Liaw | H10D 84/907 |
| 2023/0097793 | A1* | 3/2023 | Lajoie | H10D 30/6755 257/43 |
| 2024/0387328 | A1* | 11/2024 | Fornara | H10W 10/021 |

* cited by examiner

*Primary Examiner* — William B Partridge
*Assistant Examiner* — Erik A. Anderson
(74) *Attorney, Agent, or Firm* — Eschweiler & Potashnik, LLC

(57) ABSTRACT

Some embodiments relate to a method of an integrated circuit structure having a conductive structure for circuit probe testing. The method includes providing an integrated circuit structure including a substrate, a dielectric structure disposed over the substrate, and a plurality of electrodes disposed over an upper surface of the dielectric structure. The method also includes forming a first dielectric layer over the dielectric structure and the plurality of electrodes, etching the first dielectric layer over each of the plurality of electrodes, forming a conductive layer over the first dielectric layer and the plurality of electrodes, and removing at least a portion of the conductive layer to form a plurality of conductive structures over the plurality of electrodes. Each of the plurality of conductive structures contacts a corresponding subset of the plurality of electrodes.

20 Claims, 13 Drawing Sheets

METHOD OF FORMING A PLURALITY OF CONDUCTIVE INTERCONNECT STRUCTURES FOR CIRCUIT PROBE TESTING OF AN INTEGRATED CIRCUIT STRUCTURE

BACKGROUND

Continued advancement in integrated circuit (IC) technology results in increased functionality and capacity for the associated IC devices. This advancement increases the importance of accurate and non-destructive IC testing that may be performed at both the wafer and individual device level. One form of IC testing is circuit probe (CP) testing, during which various types of functional, voltage, and/or current testing may be performed. Consequently, an IC manufacturer may employ CP testing to determine whether the IC under test meets the expectations of the customer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
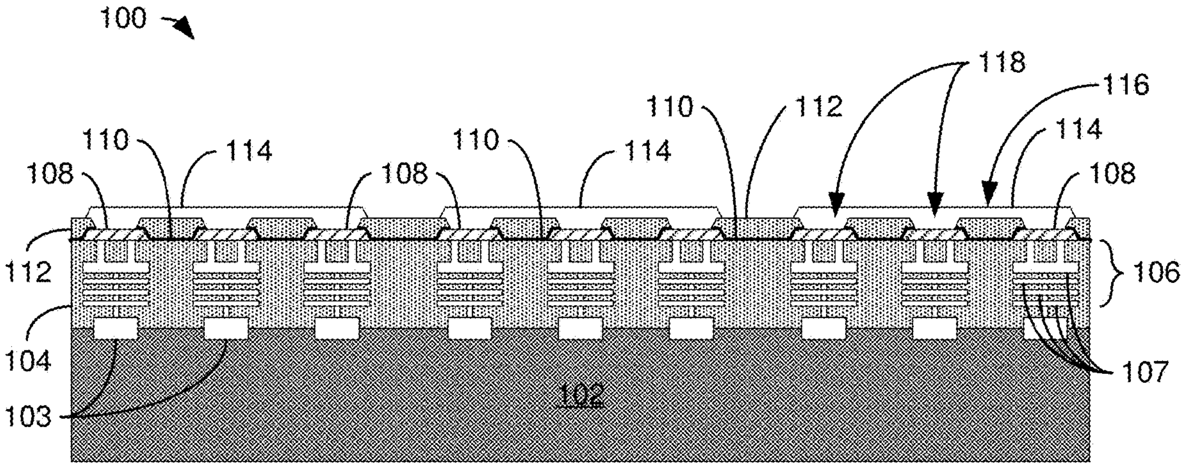
FIG. 1A illustrates a cross-sectional view of some embodiments of an IC device employing a conductive structure for CP testing, according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the trend to smaller IC features continues, the corresponding size and/or thickness of accessible metal structures, such as electrodes (e.g., electrodes for display panel pixels that may be implemented in micro-driver chiplets), tends to decrease in a corresponding manner. This trend, while increasing the capacity and functionality of the associated IC technology, may also impact the ability to test the resulting ICs, such as by way of circuit probe (CP) testing, which may be performed at the wafer level. For example, by reducing the size and thickness of an electrode, direct hardware probing of the electrode (e.g., by way of a probe card) may be required to be significantly more precise and less forceful than is currently possible to enable accurate testing without damaging the electrode.

To address these issues, the present disclosure provides some embodiments of an IC device that includes a conductive structure for CP testing. In some embodiments, a dielectric layer disposed over a plurality of electrodes is patterned to expose the electrodes. Disposed over the dielectric layer and the electrodes is a plurality of conductive structures. Each of the conductive structures may contact a subset of the electrodes. In some embodiments, each conductive structure may serve as a CP landing pad for receiving a test probe to electrically interact with the subset of the electrodes contacted by the conductive structure. Also, in some embodiments, the subset of the electrodes may be arranged as a two-dimensional electrode array under the corresponding conductive structure.

Accordingly, use of some embodiments of the conductive structures may provide wider, stronger access points through which electrical connection of a CP testing system with the electrodes of the IC device may be made. In some embodiments, the conductive structures and associated dielectric layer may be removed after CP testing to facilitate functional access to the electrodes, the inclusion of additional IC layers or structures, and/or the like.

FIG. 1A illustrates a cross-sectional view of some embodiments of an IC device 100 employing a conductive structure 114 for CP testing of the IC device 100, according to the present disclosure. As is described in greater detail below, in some embodiments, IC device 100 is shown in FIG. 1A in a state in which CP testing may be performed thereon and may include material that is not ultimately retained in a functional device. IC device 100 may include a substrate 102 and a dielectric structure 104 disposed over the substrate 102. In some embodiments, the dielectric structure 104 may include a conductive structure 106 (e.g., conductive layers 107, conductive interconnection contacts and/or vias, and/or the like) that couples an electronic circuit 103 to at least one corresponding electrode 108 of a plurality of electrodes 108 disposed over an upper surface of the dielectric structure 104.

In some embodiments, the electronic circuit 103 may be a panel display micro-driver for a sub-pixel associated with the corresponding electrode 108. For example, a voltage potential of the electrode 108 may cause the sub-pixel to exhibit a particular brightness. To provide the sub-pixels of the IC device 100, one or more additional layers and/or structures (e.g., a liquid crystal (LC) layer, a color filter, a common electrode, and/or the like) may be formed over the electrodes 108.

Each of the electronic circuits 103 is depicted in FIG. 1A as a generalized functional block, as the electronic circuits 103 may take a number of different forms (e.g., one or more transistors, such as metal-oxide-semiconductor field-effect transistors (MOSFETs), thin film transistors (TFTs), one or more capacitors, and/or other components in various configurations).

In some embodiments, a first protective film 110 may be disposed over each of the electrodes 108 and the portions of the upper surface of the dielectric structure 104 lying between the electrodes 108. In some embodiments, the first protective film 110 may provide some level of protection for underlying portions of the IC device 100 during subsequent IC processing operations.

In some examples, each electrode 108 may be extremely small (e.g., less than 10 μm in width), making direct probing difficult. Thus, in some embodiments, to facilitate CP testing, a first dielectric layer 112 may be formed over the first protective film 110. Thereafter, portions of the first dielectric layer 112 and the first protective film 110 positioned over the electrodes 108 may be removed. Subsequently, a plurality of conductive structures 114 may be formed over the electrodes 108 and the first dielectric layer 112 to serve as CP landing pads. In some embodiments, each conductive structure 114 may contact and substantially cover a subset of the plurality of electrodes 108 to facilitate testing of each of the associated electronic circuits 103 coupled to the subset of electrodes 108. Each of the conductive structures 114 is shown in the example of FIG. 1A as being of sufficient length to contact three of the electrodes 108 lying under the conductive structure 114. Also, in some embodiments, each conductive structure 114 includes a landing portion 116 and a plurality of conductive columns 118. In some embodiments, each conductive column 118 extends downward through the first dielectric layer 112 to contact a corresponding one of the subset of electrodes 108 associated with the conductive structure 114. Also, in some embodiments, a width of each conductive column 118 may be less than or equal to a width of the corresponding one of the subset of electrodes 108.

Figure 1B:
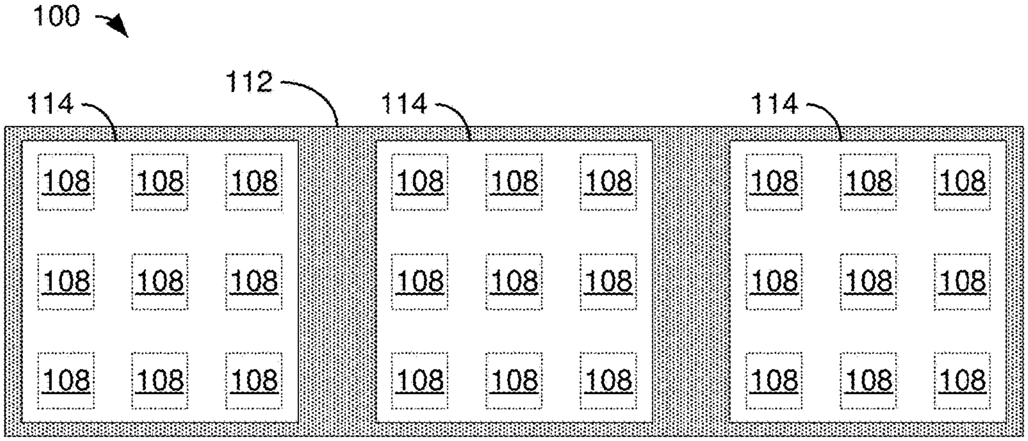
FIG. 1B illustrates a plan view of some embodiments of an IC device employing a conductive structure for CP testing, according to the present disclosure.

FIG. 1B illustrates a plan view of some embodiments of the IC device 100 employing the conductive structure 114 for CP testing of the IC device 100, according to the present disclosure. As depicted in FIG. 1B, in some embodiments, each conductive structure 114 is substantially rectangular (e.g., square) in shape and is of sufficient size to cover three electrodes 108 in both lateral dimensions. Consequently, in FIGS. 1A and 1B, each conductive structure 114 may contact nine electrodes 108. Moreover, each conductive structure 114 may be much larger in the plan view than each of the associated electrodes 108 coupled therewith, thus facilitating a much larger and more stable landing surface for a CP probe than the electrodes 108 themselves while also providing a protective layer for the electrodes 108 during CP testing. For example, in some embodiments (e.g., in which a minimum length and width of approximately 40 microns (μm) of the conductive structure 114 is desired for compatibility with a CP probe), a three-rows-by-three-columns arrangement of electrodes 108 for a single conductive structure 114, as shown in FIG. 1B, may be considered a minimum size, while other larger arrangements (e.g., three-by-four, four-by-three, four-by-four, four-by-five, five-by-four, five-by-five, and so on) are also acceptable in such embodiments.

While each conductive structure 114 contacts nine electrodes 108 in the embodiments of FIGS. 1A and 1B, in other embodiments, each conductive structure 114 may be dimensioned to contact any number of two or more electrodes 108. Also, a conductive structure 114 may possess a shape other than square or rectangular in the plan view.

FIGS. 2A-2I illustrate cross-sectional views of some embodiments of a semiconductor structure for an IC device employing a conductive structure for CP testing at various stages of manufacture. Although FIGS. 2A-2I are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 2A:
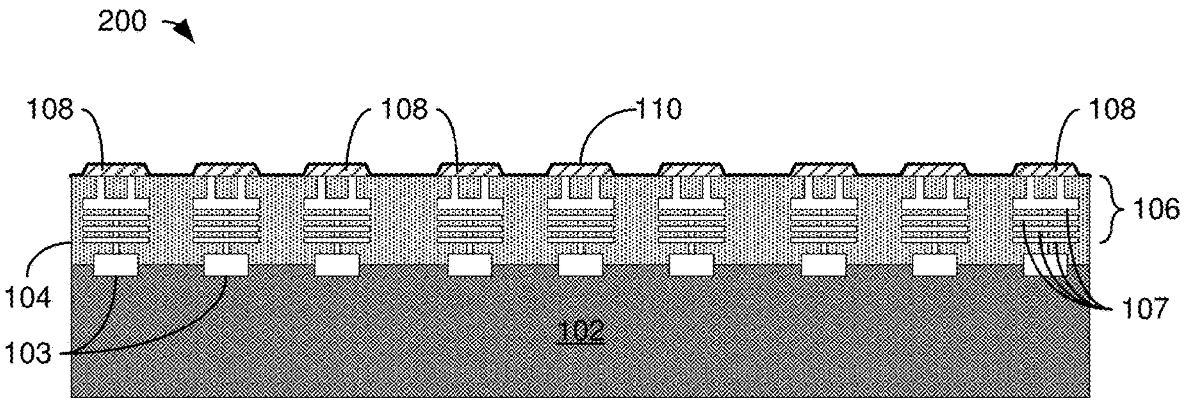
FIGS. 2A-2I illustrate cross-sectional views of some embodiments of a semiconductor structure for an IC device employing a conductive structure for CP testing at various stages of manufacture.

FIG. 2A illustrates a semiconductor structure that may represent a partially constructed IC device 200 that may serve as a base structure upon which additional processing acts, as depicted in FIGS. 2B-2I, may be performed. In some embodiments, as described above, the IC device 200 includes a substrate 102 (e.g., a silicon substrate) and a dielectric structure 104 (e.g., one or more layers of a dielectric material, such as silicon dioxide ($SiO_2$)) disposed over the substrate 102. A plurality of electrodes 108 are disposed over an upper surface of the dielectric structure 104. The electrodes 108 may include metal (e.g., aluminum, gold, titanium, ruthenium, iridium, rhodium, molybdenum, copper, or some other metal, or an alloy thereof) and/or another conductive material. In some embodiments, each electrode 108 may be coupled to a corresponding electronic (e.g., micro-driver) circuit 103 by way of an associated conductive structure 106 that may include one or more conductive layers 107 and associated interconnection contacts, vias, and/or the like.

In some embodiments, a first protective film 110 may be disposed over the electrodes 108 and the exposed portions of the dielectric structure 104. In some embodiments, the first protective film 110 may include tantalum, a tantalum compound, or another material that may protect against mechanical and/or electrical damage to the IC device 200. Also, in some embodiments, the first protective film 110 may be formed on the electrodes 108 and the dielectric structure 104 by atomic layer deposition (ALD), chemical vapor deposition (CVD), and/or the like. In some embodiments, the first protective film 110 may provide some level of protection for the electrodes 108 and other portions of the IC device 100 when the IC device 100 is transferred from one location to another during the fabrication process. Additionally or alternatively, in some embodiments, the first protective film 110 may serve as a barrier to protect portions of the underlying structure from subsequent IC processing operations. Also, in some embodiments, IC device 200, as illustrated in FIG. 2A, is in a state in which additional processing operations, such as the forming of additional functional layers over the electrodes 108 and the dielectric structure 104, may be performed thereon. Subsequent operations described below, as depicted in FIGS. 2B-2I, are undertaken to provide conductive structures that facilitate CP testing of the electronic circuits 103 by way of the electrodes 108.

Figure 2B:
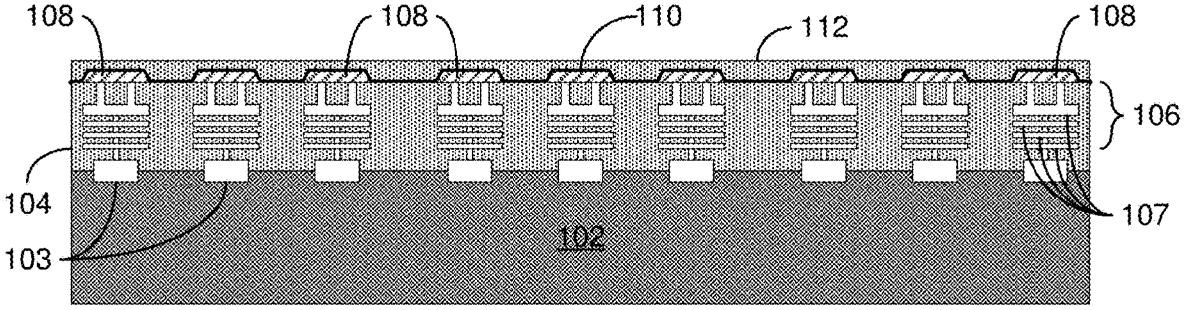

FIG. 2B illustrates the forming (e.g., deposition) of a first dielectric layer 112 (e.g., $SiO_x$ or another dielectric material) over the electrodes 108 and exposed portions of the dielectric structure 104. In some embodiments, the first dielectric layer 112 may serve as a layer upon which the conductive structures 114 are to be formed.

Figure 2C:
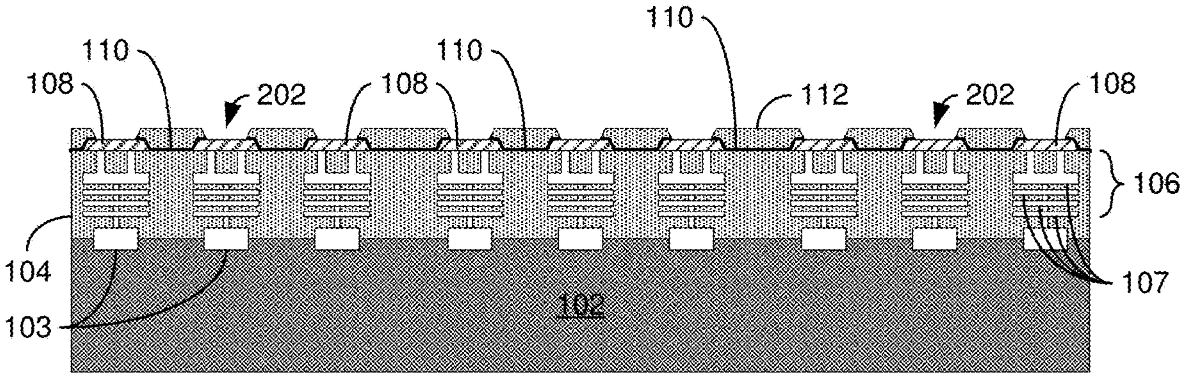

FIG. 2C illustrates the patterning (e.g., etching using photolithography or other processes) of portions 202 of the first dielectric layer 112 and the first protective film 110 that cover at least some of each of the electrodes 108. In some embodiments, a central portion of each of the electrodes 108 in a plan view may be exposed while leaving a peripheral portion of the electrodes 108 covered by the first dielectric layer 112 and/or the first protective film 110. In some embodiments, the removed portions 202 of the first dielectric layer 112 may be dimensioned to facilitate the formation of vias for a subsequent redistribution layer for an IC device.

Figure 2D:
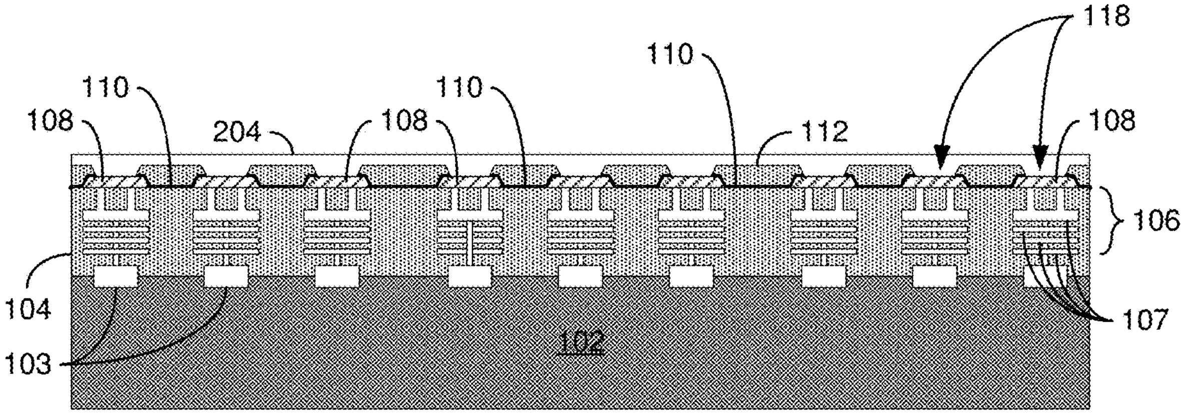

FIG. 2D illustrates the forming (e.g., deposition) of a conductive layer 204 that includes a conductive material (e.g., a metal, such as aluminum, gold, tin, copper, and/or an alloy thereof, or another conductive material). In some embodiments, the conductive layer 204 includes conductive columns 118, each of which extends downward to contact a corresponding electrode 108. In some embodiments, a thickness of the conductive layer 204 may be dimensioned similarly to a redistribution layer with associated vias for an IC device.

Figure 2E:
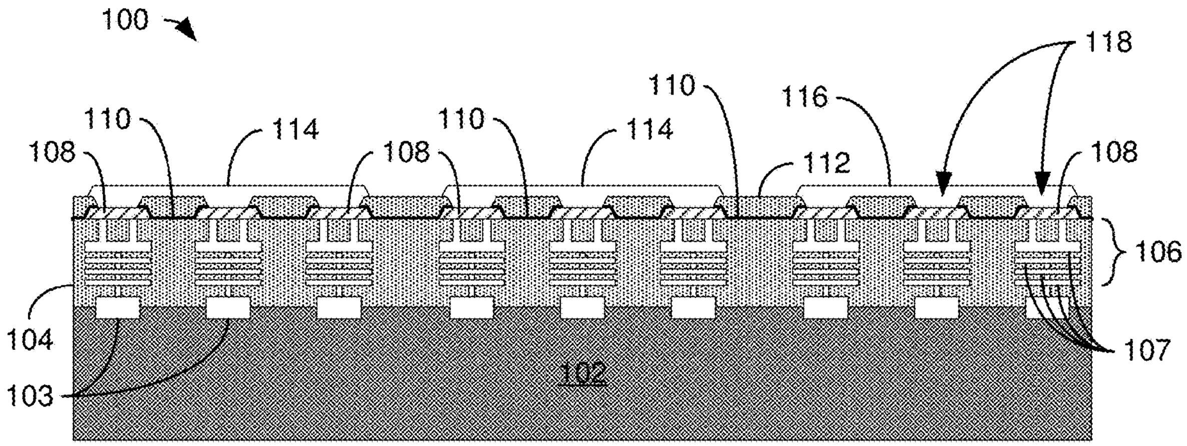

FIG. 2E illustrates the patterning (e.g., etching) of the conductive layer 204 to create a plurality of conductive structures 114. In some embodiments, each conductive structure 114 includes a landing portion 116 and a plurality of conductive columns 118 coupled thereto. Further, in some embodiments, each conductive structure 114 contacts each of a subset (e.g., two or more) of the plurality of electrodes 108 by way of an associated conductive column 118, as described in greater detail above.

Figure 2F:
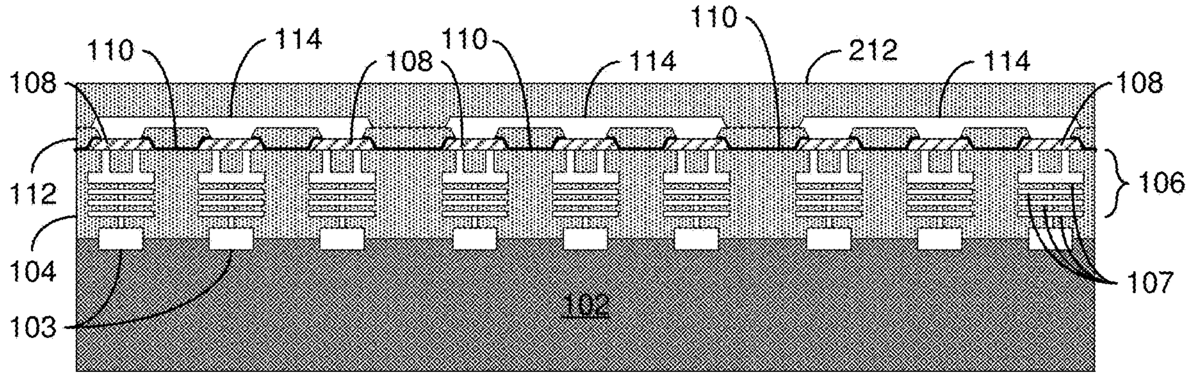

In some embodiments, FIG. 2E depicts a state of the IC device 100 in which CP testing may be performed on each of the associated electronic circuits 103 coupled to the subset of electrodes 108 by way of the plurality of conductive structures 114. In other embodiments, the IC device 100 may be further processed to enhance CP testing operations. FIG. 2F, for example, illustrates the forming (e.g., deposition) of a second dielectric layer 212 over the plurality of conductive structures 114 and the first dielectric layer 112. In some embodiments, the second dielectric layer 212 may include $SiO_x$ or another dielectric material.

Figure 2G:
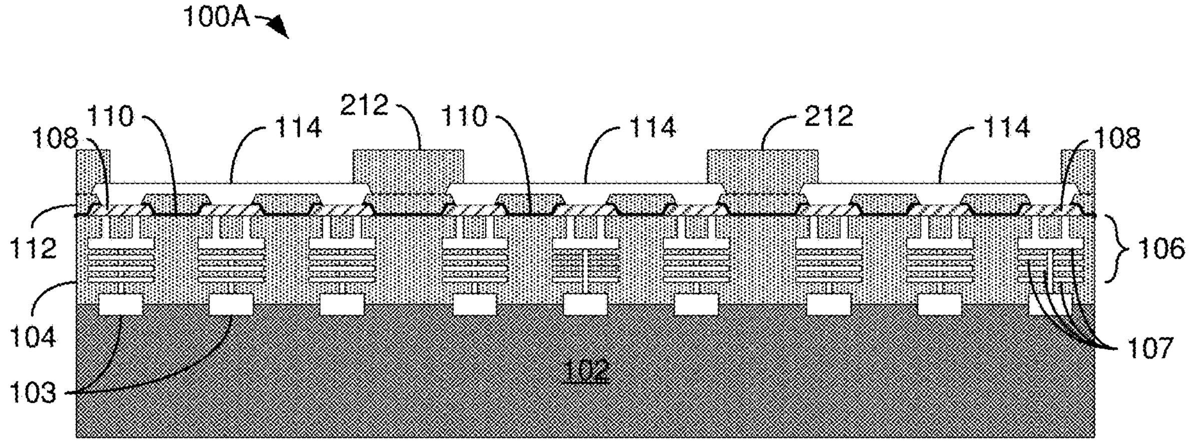

FIG. 2G illustrates the patterning (e.g., etching) of the second dielectric layer 212 to remove portions of the second dielectric layer 212 over each of the plurality of conductive structures 114 to expose the conductive structures 114. In some embodiments, a peripheral portion of each of the conductive structures 114 remains covered by the second dielectric layer 212 while an upper surface of the second dielectric layer 212 resides at a higher level than an upper surface of the conductive structures 114. In some embodiments, the patterned second dielectric layer 212 which may serve to protect the edges of the conductive structures 114 and to prevent electrically shorting two adjacent conductive structures 114 by a probe during CP testing. Consequently, the resulting IC device 100A shown in FIG. 2G may represent additional embodiments that facilitate CP testing aside from those represented in FIG. 2E.

Figure 2H:
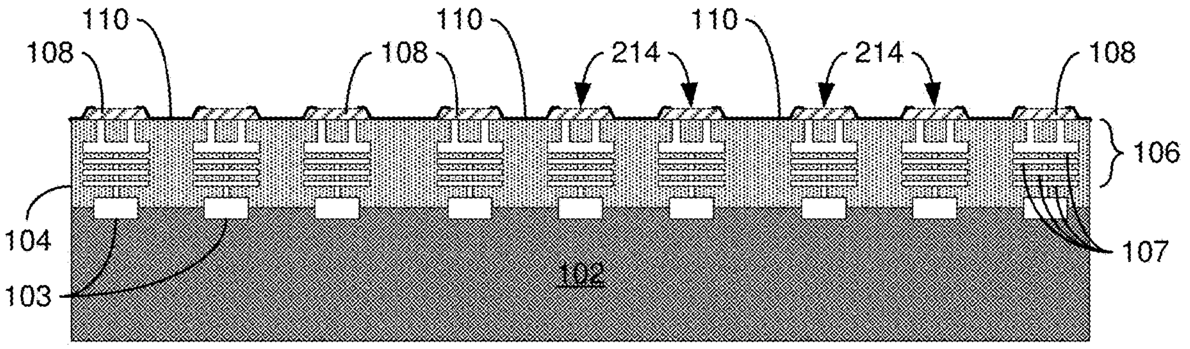

FIG. 2H illustrates removal (e.g., using a dry and/or wet etching process) of the plurality of conductive structures 114, the first dielectric layer 112, and the second dielectric layer 212 (if present). In some embodiments, this removal exposes the plurality of electrodes 108 and portions of the first protective film 110 remaining after the patterning operation illustrated in FIG. 2C. In some embodiments, the first protective film 110 may protect the underlying dielectric structure 104 from damage during the removal operation of FIG. 2H. Also, in some embodiments, the removal operation of FIG. 2H may be performed after CP testing of the electronic circuits 103 is completed.

In some embodiments, the removal operation of FIG. 2H may leave a residue of one or more contaminants on an upper surface 214 of the plurality of electrodes 108, thus making subsequent contact with the electrodes 108 by additional layers of the IC device subsequently formed thereover potentially problematic. For example, in some embodiments, such contaminants may include dislodged barrier material (e.g., tantalum and/or other barrier material). In some embodiments, the contaminants may include dry etching by-products (e.g., carbon, fluoride, and/or other material) remaining after the removal operation of FIG. 2H. Also, in some embodiments, the contaminants may include a conductor material (e.g., aluminum or another metal) that may have leaked onto the upper surface 214 of the electrodes 108 through a seam in a barrier metal (e.g., tantalum nitride (TaN)) serving as a lining for the conductive columns 118 of the conductive structures 114. The presence of other contaminants is also possible. Accordingly, in some embodiments, the removal operation of FIG. 2H may be followed by a cleaning operation (e.g., the application and rinsing of one or more solvents) directed at least at the upper surface 214 of the electrodes 108. In some embodiments, this cleaning process may produce a recess in the upper surface 214 of the electrodes 108 of approximately 100 angstroms or less.

Figure 2I:
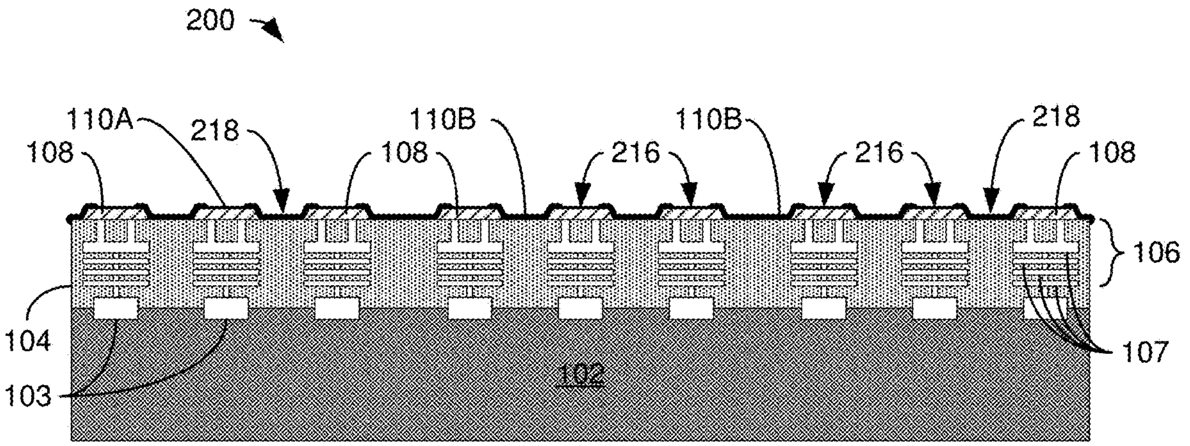

FIG. 2I illustrates forming (e.g., deposition) of a second protective film 110A over the first protective film 110 and the plurality of electrodes 108. In some embodiments, the second protective film 110A may include tantalum, a tantalum compound, or another material. In some embodiments, the second protective film 110A may protect the resulting IC device 200 against mechanical and/or electrical damage to the IC device, such as during a physical transfer of the resulting structure of FIG. 2I to another party (e.g., a customer).

In some embodiments, the forming of the second protective film 110A over the first protective film 110 and the electrodes 108 may result in a first thickness 216 of the second protective film 110A over the electrodes 108 and a second thickness 218 of the combined protective film 110B (including the first protective film 110 and the second protective film 110A) between the electrodes 108, as well as possibly over a peripheral portion of each of the electrodes 108. In some embodiments, the first thickness 216 may lie within a first range of 100 to 400 angstroms, 250 to 300 angstroms, or another range of values. In some embodiments, the second thickness 218 may lie within a second range of 150 to 600 angstroms, 200 to 500 angstroms, or another range of values. In some embodiments, a difference between the first thickness 216 and the second thickness 218 may lie in a range of 50 to 300 angstroms, 100 to 200 angstroms, or another range of values. In some embodiments, use of the various thicknesses for the first protective film 110 and the second protective film 110A, as described above, may facilitate acceptable protection of the dielectric structure 104 and the electrodes 108 during different processing stages of the IC device, such as in preparation for CP testing (e.g., as shown in FIGS. 2E and 2G), and for subsequent transfer to another party (e.g., as depicted in FIG. 2I).

Figure 3:
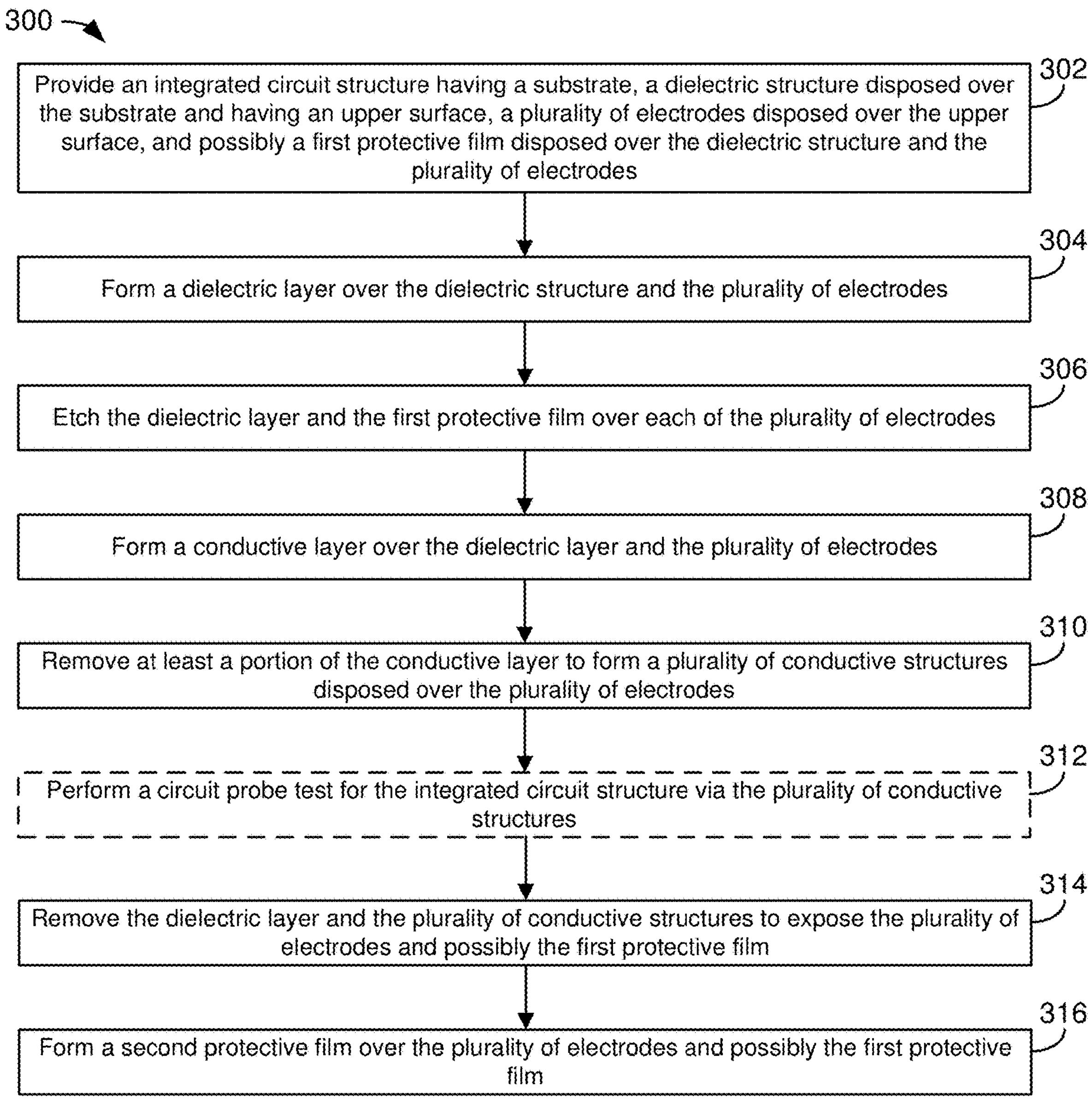
FIG. 3 illustrates a methodology of forming an IC device employing a conductive structure for CP testing in accordance with some embodiments.

FIG. 3 illustrates a methodology 300 of forming a conductive structure for CP testing for an IC device, in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Acts 302 through 316 may correspond, for example, to the structure previously illustrated in FIGS. 2A through 2I in some embodiments. At Act 302, for example, an IC having a substrate (e.g., substrate 102 of FIG. 2A), a dielectric structure (e.g., dielectric structure 104 of FIG. 2A) disposed over the substrate and having an upper surface, and a plurality of electrodes (e.g., electrodes 108 of FIG. 2A) disposed over the upper surface of the dielectric structure, may be provided. In some embodiments, the IC structure may further include a first protective film (e.g., first protective film 110 of FIG. 2A) disposed over the dielectric structure and the plurality of electrodes. FIG. 2A illustrates a cross-sectional view of some embodiments corresponding to Act 302.

At Act 304, a dielectric layer (e.g., first dielectric layer 112 of FIG. 2B) may be formed over the dielectric structure and the plurality of electrodes. FIG. 2B illustrates a cross-sectional view of some embodiments corresponding to Act 304.

At Act 306, at least portions (e.g., portions 202 of FIG. 2C) of the first dielectric layer over the electrodes may be removed or patterned (e.g., etched). FIG. 2C illustrates a cross-sectional view of some embodiments corresponding to Act 306.

At Act 308, a conductive layer (e.g., conductive layer 204 of FIG. 2D) may be formed over the first dielectric layer and the plurality of electrodes. FIG. 2D illustrates a cross-sectional view of some embodiments corresponding to Act 308.

At Act 310, at least a portion of the conductive layer may be removed or patterned (e.g., etched) to form a plurality of conductive structures (e.g., conductive structures 114 of FIG. 2E) disposed over the plurality of electrodes. FIG. 2E illustrates a cross-sectional view of some embodiments corresponding to Act 310.

Further, in some embodiments, an additional dielectric layer (e.g., second dielectric layer 212 of FIG. 2F) may be formed over the plurality of conductive structures and the first dielectric structure, as illustrated in FIG. 2F. Additionally, in some embodiments, portions of the second dielectric layer over the conductive structures 114 may be removed or patterned (e.g., etched), as depicted in FIG. 2G.

At Act 312, a circuit probe (CP) test for the integrated circuit structure may be performed via the plurality of conductive structures (e.g., as the integrated circuit structure is depicted in FIG. 2E or FIG. 2G). In some embodiments, the CP test may include a yield test that determines which dice of a wafer are electrically and/or functionally sufficient for use.

At Act 314, the plurality of conductive structures, the first dielectric layer, and the second dielectric layer (if present) are removed to expose the plurality of electrodes and the first protective film (if present). FIG. 2H illustrates a cross-sectional view of some embodiments corresponding to Act 314. In some embodiments, some contaminants or residue resulting from this removal operation or a previous operation performed on the IC structure may remain on the electrodes. Accordingly, in some embodiments, a cleaning process (e.g., using one or more solvents) may be performed on the electrodes to remove such contaminants or residue.

At Act 316, a protective film (e.g., a second protective film 110A of FIG. 2I) may be formed over the electrodes and the first protective film (if present). FIG. 2I illustrates a cross-sectional view of some embodiments corresponding to Act 316.

Figure 4A:
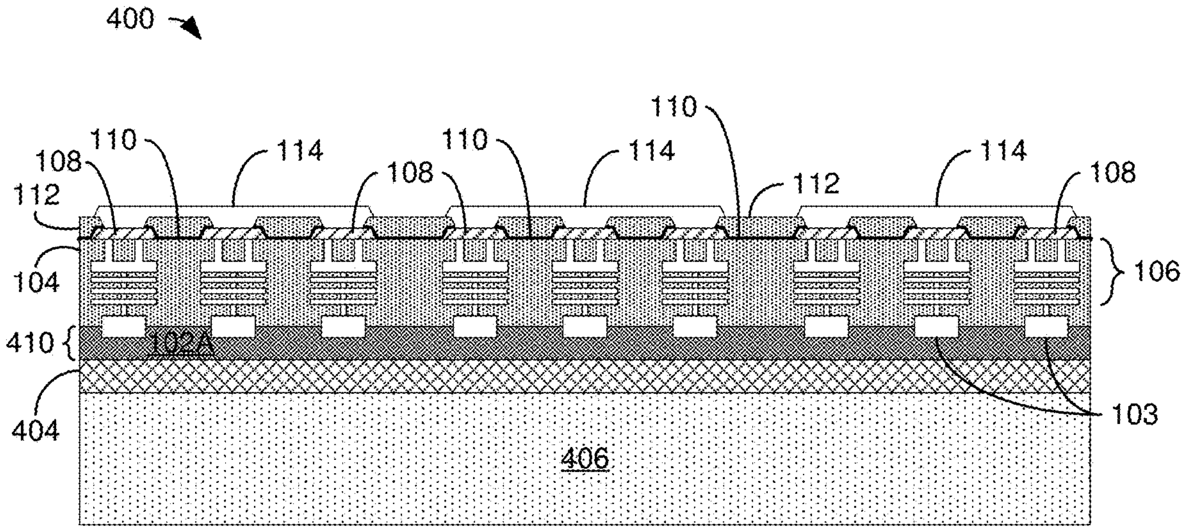
FIGS. 4A and 4B illustrate cross-sectional views of some embodiments of a semiconductor structure for an IC device employing a thinned substrate and a conductive structure for CP testing at particular stages of manufacture corresponding with FIGS. 2E and 2I, respectively.
Figure 4B:
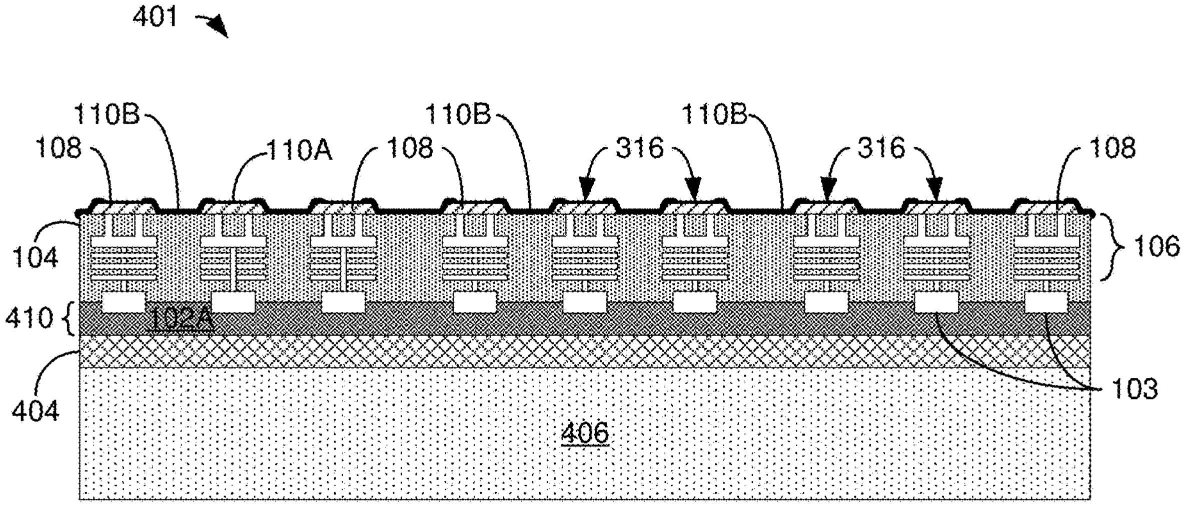

FIGS. 4A and 4B each illustrate cross-sectional views of some embodiments of a semiconductor structure for an IC device employing a thinned (or "thin-down") substrate 102A and a conductive structure 114 for CP testing at particular stages of manufacture corresponding with FIGS. 2E and 2I, respectively. More specifically, in some embodiments, an IC device 400 of FIG. 4A includes a structure similar to IC device 100 of FIG. 2E, including a plurality of conductive structures 114 coupled to a plurality of electrodes 108 that is configured to facilitate CP testing of a plurality of electronic circuits 103, as discussed above. Further, in some embodiments, IC device 401 includes a structure similar to IC device 200 of FIG. 2I, in which a second protective film 110A is disposed over the plurality of electrodes 108 and a first protective film 110.

However, in both FIGS. 4A and 4B, a thinned substrate 102A, to which a carrier structure 406 is attached on a lower surface of the thinned substrate 102A by way of an adhesive layer 404 replaces the substrate 102 of FIGS. 2E and 2I. In some embodiments, the thinned substrate 102A may have a thickness 410 (e.g., 3-10 μm) that is less than a corresponding thickness of the dielectric structure 104. As employed herein, a carrier structure is a wafer-sized structure that includes silicon, glass, quartz, or another material and is attached or adhered to a lower surface of a thinned silicon wafer to provide stability to, and prevent breakage of, a substrate during the IC manufacturing process. Consequently, in some embodiments, use of the carrier structure 406 may facilitate the use of the conductive structures 114 for CP testing of IC devices using a thinned substrate 102A.

FIGS. 5A-5G illustrate cross-sectional views of some embodiments of a semiconductor structure for an IC device employing a thinned substrate 102A and a conductive structure 114 for CP testing at various stages of manufacture.

Figure 5A:
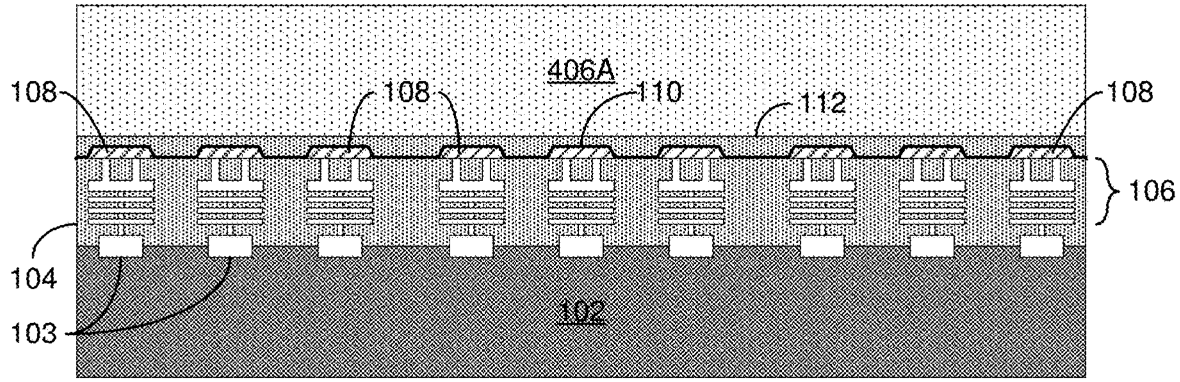
FIGS. 5A-5G illustrate cross-sectional views of some embodiments of a semiconductor structure for an IC device employing a thinned substrate and a conductive structure for CP testing at various stages of manufacture.

FIG. 5A illustrates a semiconductor structure that may represent a partially constructed IC device that may serve as a base structure upon which additional processing acts, as depicted in FIGS. 5B-5G, may be performed. In some embodiments, as described above, the IC device includes a substrate 102 and a dielectric structure 104 disposed thereover. A plurality of electrodes 108 are disposed over an upper surface of the dielectric structure 104. The electrodes 108 may include metal and/or another conductive material. In some embodiments, each electrode 108 may be coupled to a corresponding electronic circuit 103 by way of an associated conductive structure 106 that lies within the dielectric structure 104 and that includes one or more conductive layers and associated interconnection contacts, vias, and/or the like.

In some embodiments, a first protective film 110 may be disposed over the electrodes 108 and the exposed portions of the dielectric structure 104, as described above in conjunction with FIG. 2A. Further, in some embodiments, a first dielectric layer 112 is formed (e.g., deposited) over the first protective film 110. Thus, in some embodiments, the IC device of FIG. 5A includes the IC structure illustrated in FIG. 2B. In addition, the IC device of FIG. 5A includes a first carrier structure 406A that is coupled to an upper surface of the first dielectric layer 112 to provide support for the IC device during subsequent IC operations, such as performing a backside thin-down operation on the substrate 102.

Figure 5B:
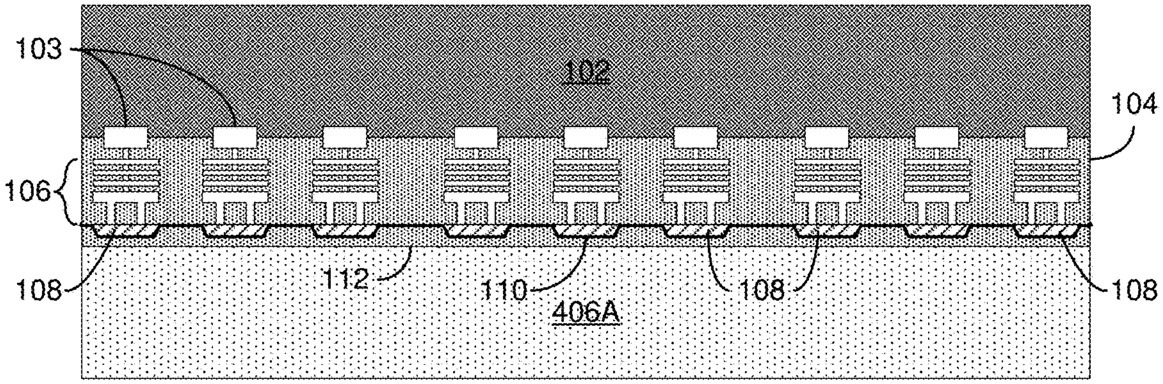
Figure 5C:
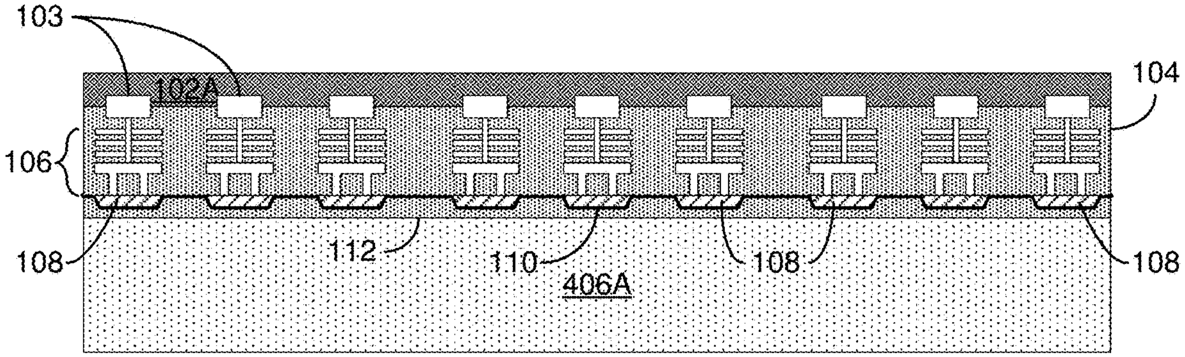

FIG. 5B illustrates a flipping over (e.g., a physical inversion by 180 degrees) of the IC device of FIG. 5A such that the substrate 102 is facing upward and the first carrier structure 406A is facing downward. Thereafter, FIG. 5C illustrates the removal of a portion of the substrate 102 by way of a thin-down operation (e.g., grinding and/or other processes of removing material from the substrate 102). In some embodiments, a thickness of the thin-down substrate 102A (e.g., 3-10 μm) may be less than a thickness of the dielectric structure 104 that is disposed over the thin-down substrate 102A. In some embodiments, the thin-down substrate 102A may be advantageous for use in micro-drivers for panel displays, as well as in other advanced technology devices.

Figure 5D:
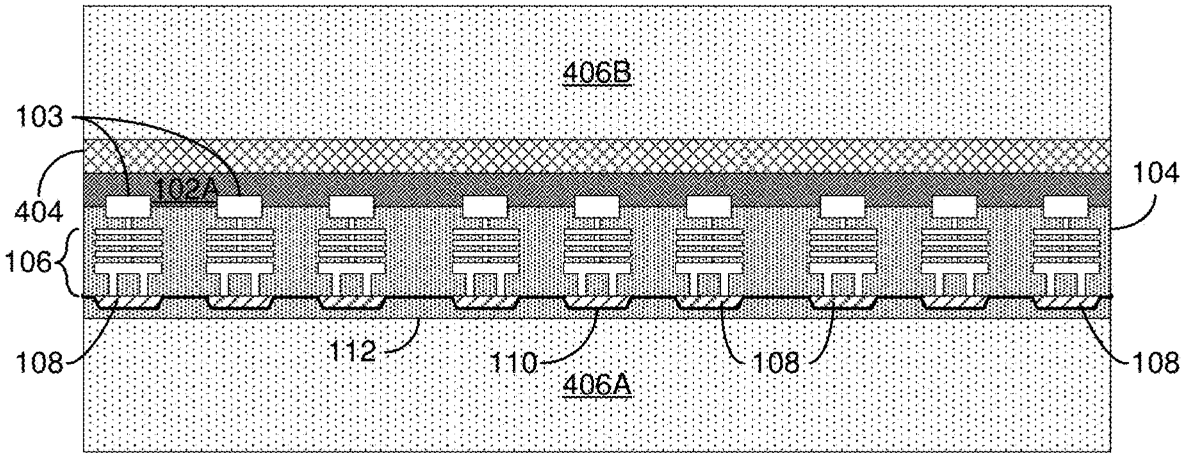

FIG. 5D illustrates a coupling (e.g., adhering) of a second carrier structure 406B to the thin-down substrate 102A via an adhesive layer 404. Accordingly, at this stage, the first carrier structure 406A and the second carrier structure 406B are attached to opposing sides of the IC structure of FIG. 5D.

Figure 5E:
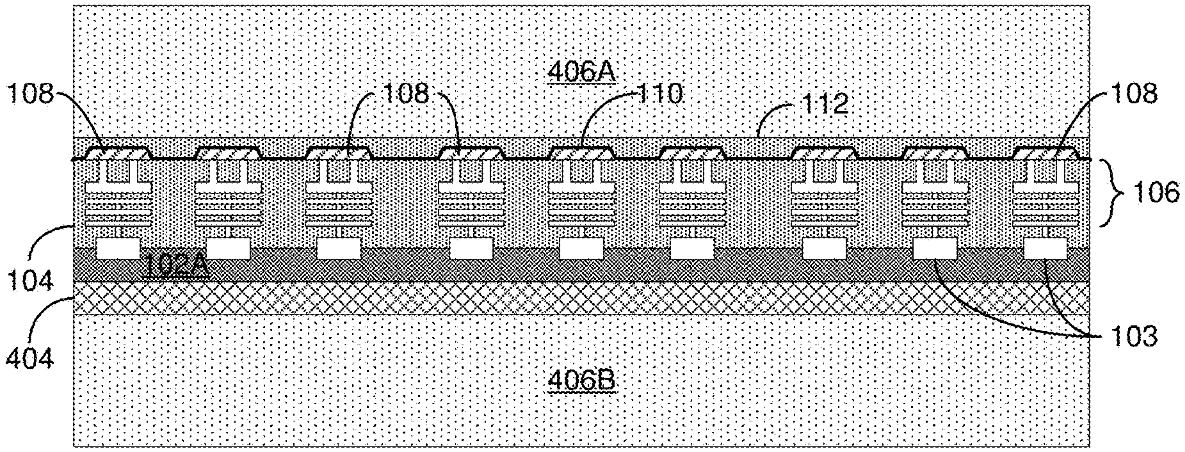

FIG. 5E illustrates another flipping over (e.g., another physical inversion) of the IC device such that the second carrier structure 406B is facing downward and the first carrier structure 406A is facing upward.

Figure 5F:
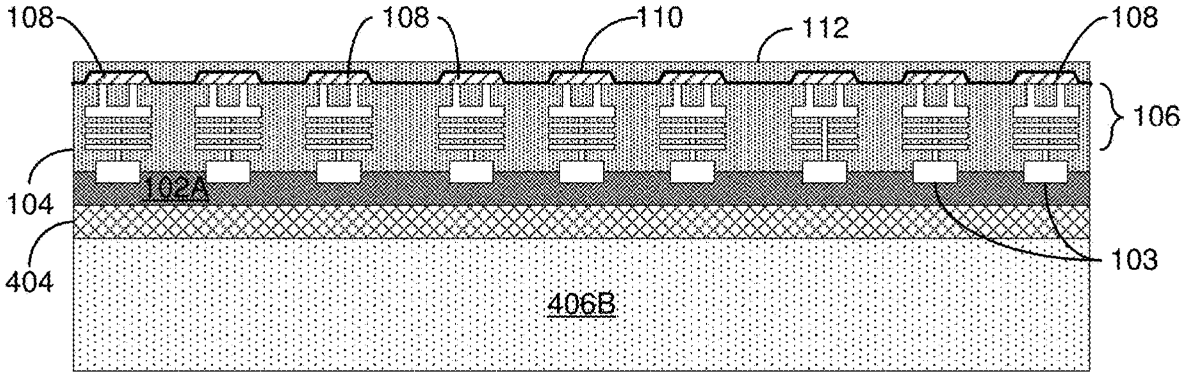

FIG. 5F illustrates a removal of the first carrier structure 406A, thus exposing the first dielectric layer 112 such that additional processing to facilitate the addition of the conductive structures 114 may occur.

Figure 5G:
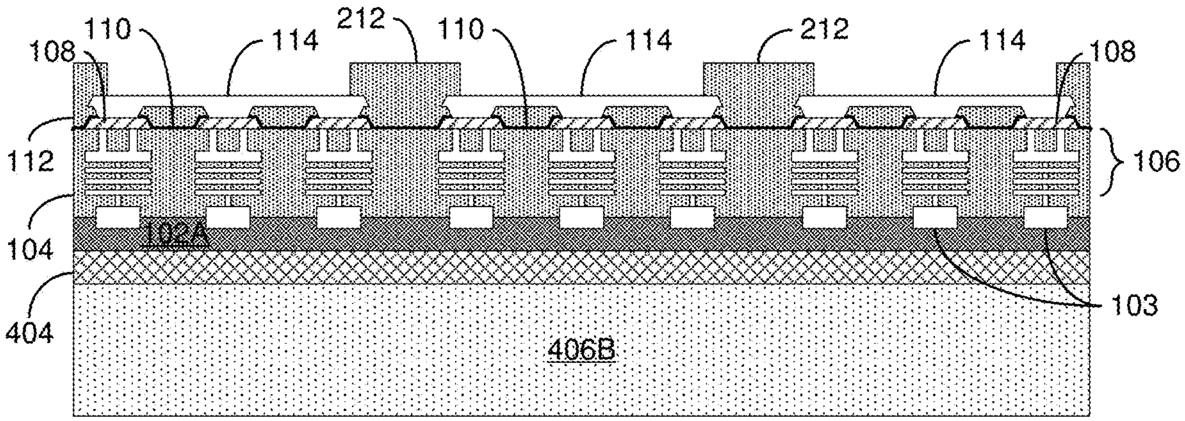

FIG. 5G illustrates further preparation of the IC structure of FIG. 5F, as depicted in FIGS. 2C through 2G and described above in conjunction therewith, to provide the conductive structures 114 and associated portion of the second dielectric layer 212 to facilitate CP testing of the electronic circuits 103. In some embodiments, the second dielectric layer 212 may be omitted, resulting in the IC structure of FIG. 2E with the thin-down substrate 102A, adhesive layer 404, and second carrier structure 406B attached. In some embodiments, the second carrier structure 406B provides strength and stability to the IC structure while CP testing occurs.

Figure 6:
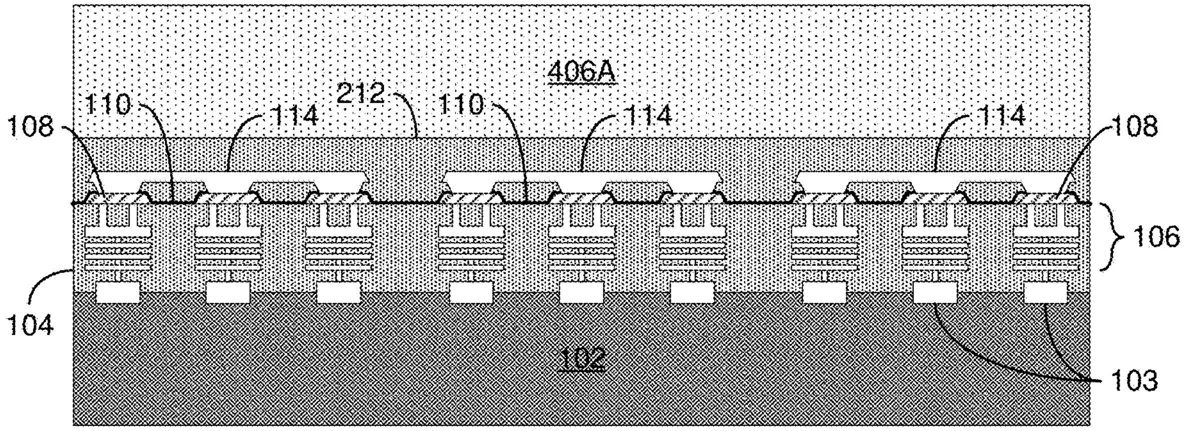
FIG. 6 illustrates a cross-sectional view of some embodiments of a semiconductor structure for an IC device employing a thinned substrate and a conductive structure for CP testing at a stage of manufacture corresponding with FIG. 2F.

FIG. 6 illustrates a cross-sectional view of some embodiments of a semiconductor structure for an IC device employing a thinned substrate and a conductive structure for CP testing at a stage of manufacture corresponding with FIG. 2F. In some embodiments, instead of thinning down the substrate 102 after the first dielectric layer 112 has been added, as indicated in FIG. 5C, FIG. 6 illustrates the addition of the conductive structures 114 and the second dielectric layer 212, as indicated in FIG. 2F and described above, prior to the addition of the first carrier structure 406A and subsequent thinning of the substrate 102. Accordingly, FIG. 6 represents the completion of a greater number of operations, as depicted in FIGS. 2C through 2F, before proceeding with operations to be completed for the thinning of the substrate 102, as indicated in FIGS. 5A through 5F.

Figure 7:
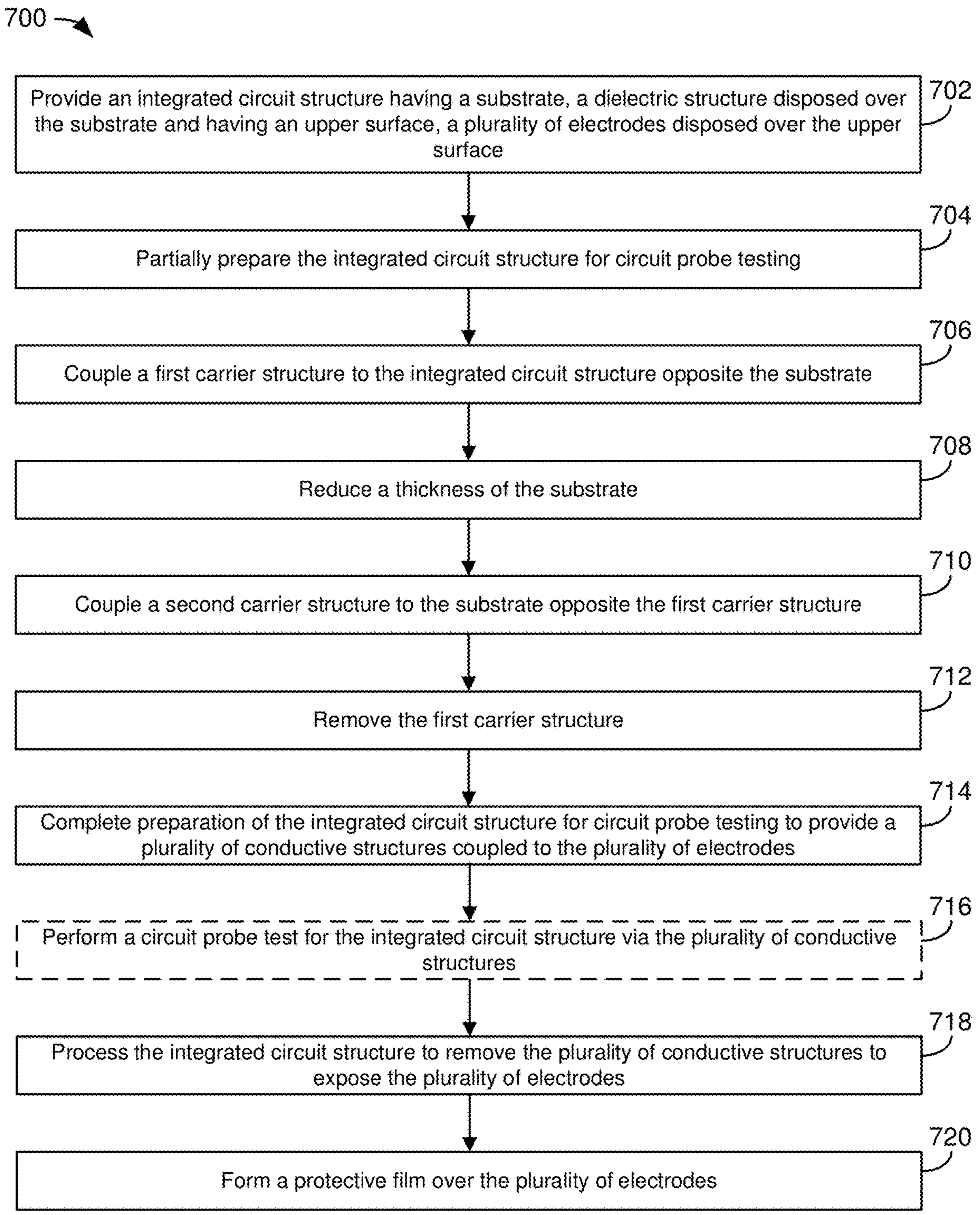
FIG. 7 illustrates a methodology of forming an IC device employing a thinned substrate and a conductive structure for CP testing in accordance with some embodiments.

FIG. 7 illustrates a methodology 700 of forming an IC device employing a thinned substrate and a conductive structure for CP testing in accordance with some embodiments. Acts 702 through 720 may correspond, for example, to the structures previously illustrated in FIGS. 2A through 2G, FIGS. 5A through 5G, and FIG. 6 in some embodiments.

At Act 702, for example, an IC structure having a substrate (e.g., substrate 102 of FIG. 2A), a dielectric structure (e.g., dielectric structure 104 of FIG. 2A) disposed over the substrate and having an upper surface, and a plurality of electrodes (e.g., electrodes 108 of FIG. 2A) disposed over the upper surface of the dielectric structure, may be provided. In some embodiments, the IC structure may further include a first protective film (e.g., first protective film 110 of FIG. 2A) disposed over the dielectric structure and the plurality of electrodes.

Additionally, in some embodiments, at Act 704, the IC structure may be partially prepared for CP testing. For example, as shown in FIG. 5A, a first dielectric layer 112 may be formed over the plurality of electrodes 108 and the first protective film 110 prior to the coupling of the first carrier structure 406A. In other embodiments, as shown in FIG. 6, the conductive structures 114 and the second dielectric layer 212 may also be formed prior to the coupling of the first carrier structure 406A.

At Act 706, the first carrier structure 406A may be coupled to the integrated circuit structure opposite the substrate 102. FIGS. 5A and 6 illustrate cross-sectional views of some embodiments corresponding to Acts 702, 704, and 706.

At Act 708, a thickness of the substrate may be reduced, resulting in a thin-down substrate (e.g., thin-down substrate 102A of FIG. 5C). FIGS. 5B and 5C illustrate cross-sectional views of some embodiments corresponding to Act 708.

At Act 710, a second carrier structure (e.g., second carrier structure 406B of FIG. 5D) is coupled to the IC structure opposite the first carrier structure. FIG. 5D illustrates a cross-sectional view of some embodiments corresponding to Act 710.

At Act 712, the first carrier structure is removed from the IC structure. FIGS. 5E and 5F illustrate cross-sectional views of some embodiments corresponding to Act 712.

At Act 714, preparation of the IC structure for CP testing is completed to provide a plurality of conductive structures (e.g., conductive structures 114 of FIG. 5G). In some embodiments in which the first dielectric layer 112 is added just prior to the first carrier structure 406A, as depicted in FIG. 5A, the continued preparation of the IC structure may include the operations illustrated in FIGS. 2C through 2E (or, alternatively, FIGS. 2C through 2G). In some embodiments in which the second dielectric layer 212 is added just prior to the first carrier structure 406A, as depicted in FIG. 6, the continued preparation of the IC structure may include the operation illustrated in FIG. 2G. FIG. 5G illustrates a cross-sectional view of some embodiments corresponding to Act 714.

At Act 716, a CP test for the IC structure may be performed via the plurality of conductive structures (e.g., as the integrated circuit structure is depicted in FIG. 5G). In some embodiments, the CP test may include a yield test that determines which dice of a wafer are electrically and/or functionally sufficient for use.

At Act 718, the integrated circuit structure may be processed to remove the plurality of conductive structures to expose the plurality of electrodes. In some embodiments, the plurality of conductive structures, the first dielectric layer, and the second dielectric layer (if present) are removed to expose the plurality of electrodes and the first protective film (if present). FIG. 2H illustrates a cross-sectional view of some embodiments corresponding to Act 718. In some embodiments, contaminants or residue resulting from this removal operation or a previous operation performed on the IC structure may remain on the electrodes. Consequently, in some embodiments, a cleaning process may be performed on the electrodes to remove the contaminants or residue, as described more fully above.

At Act 720, a protective film (e.g., a second protective film 110A of FIG. 2I) may be formed over the plurality of electrodes and the first protective film (if present). FIG. 2I illustrates a cross-sectional view of some embodiments corresponding to Act 720.

Some embodiments relate to a method of manufacturing an integrated circuit device. The method includes providing an integrated circuit structure including a substrate, a dielectric structure disposed over the substrate and having an upper surface, and a plurality of electrodes disposed over the upper surface of the dielectric structure. The method further includes forming a first dielectric layer over the dielectric structure and the plurality of electrodes, etching the first dielectric layer over each of the plurality of electrodes, forming a conductive layer over the first dielectric layer and the plurality of electrodes, removing at least a portion of the conductive layer to form a plurality of conductive structures over the plurality of electrodes. Each of the plurality of conductive structures contacts a corresponding subset of the plurality of electrodes. The method further includes performing a circuit probe test for the integrated circuit structure via the plurality of conductive structures Some embodiments relate to another method of manufacturing an integrated circuit device. The method includes providing an integrated circuit structure including a substrate, a dielectric structure disposed over the substrate and having an upper surface, and a plurality of electrodes disposed over the upper surface of the dielectric structure. The dielectric structure includes a conductive interconnection structure, and at least one of the substrate and the dielectric structure includes at least one electronic circuit coupled to the plurality of electrodes by way of the conductive interconnection structure. The method further includes forming a first protective film over the dielectric structure and the plurality of electrodes, forming a first dielectric layer over the first protective film, etching the first dielectric layer and the first protective film over each of the plurality of electrodes, forming a conductive layer over the first dielectric layer and the plurality of electrodes, and removing at least a portion of the conductive layer to form a plurality of conductive structures over the plurality of electrodes. Each of the plurality of conductive structures contacts a corresponding subset of the plurality of electrodes. The method further includes reducing a thickness of the substrate after forming the first dielectric layer.

Some embodiments relate to an integrated circuit device. The integrated circuit device includes a substrate, a dielectric structure disposed over the substrate and including an upper surface, a plurality of electrodes disposed over the upper surface of the dielectric structure, and a protective layer disposed over and contacting the plurality of electrodes and the upper surface of the dielectric structure. A first thickness of the protective layer over a central portion of each of the plurality of electrodes is less than a second thickness of the protective layer over the upper surface of the dielectric structure.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing an integrated circuit structure comprising:
- a substrate;
- a dielectric structure disposed over the substrate, the dielectric structure comprising an upper surface and including a conductive interconnection structure; and
- a plurality of electrodes disposed over the upper surface of the dielectric structure, wherein at least one of the substrate and the dielectric structure include at least one electronic circuit coupled to the plurality of electrodes by way of the conductive interconnection structure;

forming a first protective film over the dielectric structure and the plurality of electrodes;

forming a first dielectric layer over the dielectric structure and the plurality of electrodes after forming the first protective film;

etching the first dielectric layer and at least a portion of the first protective film over each of the plurality of electrodes;

forming a conductive layer over the first dielectric layer and the plurality of electrodes;

removing at least a portion of the conductive layer to form a plurality of conductive structures over the plurality of electrodes, each of the plurality of conductive structures contacting a corresponding subset of the plurality of electrodes;

performing a circuit probe test for the integrated circuit structure via the plurality of conductive structures; and removing the first dielectric layer and the plurality of conductive structures to expose the plurality of electrodes and the first protective film after removing at least a portion of the conductive layer to form the plurality of conductive structures over the plurality of electrodes.

2. The method of claim 1, wherein each of the plurality of conductive structures comprises:
- a landing portion disposed over the first dielectric layer; and
- a plurality of conductive columns extending downward from the landing portion through the first dielectric layer, each of the plurality of conductive columns contacting an associated one of the corresponding subset of the plurality of electrodes.

3. The method of claim 2, wherein a width of each of the plurality of conductive columns is less than or equal to a width of the associated one of the corresponding subset of the plurality of electrodes.

4. The method of claim 1, wherein the corresponding subset of the plurality of electrodes is arranged in a plan view as a two-dimensional electrode array comprising nine electrodes and having a minimum of three rows of electrodes and three columns of electrodes.

5. The method of claim 1, wherein:
- the integrated circuit structure further comprises at least one electronic circuit residing in at least one of the substrate and the dielectric structure, the at least one electronic circuit coupled to the plurality of electrodes; and
- performing the circuit probe test comprises testing the at least one electronic circuit.

6. The method of claim 1, further comprising:
- forming a second dielectric layer over the plurality of conductive structures and the first dielectric layer; and
- etching the second dielectric layer over at least a portion of each of the plurality of conductive structures.

7. The method of claim 6, wherein an upper surface of the second dielectric layer is higher than an upper surface of each of the plurality of conductive structures.

8. The method of claim 1, further comprising:
- forming a second protective film over the plurality of electrodes and the first protective film to create a combined protective film having a first thickness over the plurality of electrodes and a second thickness over the upper surface of the dielectric structure, wherein the second thickness is greater than the first thickness.

9. A method, comprising:
- providing an integrated circuit structure comprising:
  - a substrate;
  - a dielectric structure disposed over the substrate, the dielectric structure comprising an upper surface and including a conductive interconnection structure; and
  - a plurality of electrodes disposed over the upper surface of the dielectric structure, wherein at least one of the substrate and the dielectric structure includes at least one electronic circuit coupled to the plurality of electrodes by way of the conductive interconnection structure;
- forming a first dielectric layer over the dielectric structure and the plurality of electrodes;
- etching the first dielectric layer over each of the plurality of electrodes;
- forming a conductive layer over the first dielectric layer and on the plurality of electrodes;
- removing at least a portion of the conductive layer to form a plurality of conductive structures over the plurality of electrodes, wherein a first conductive structure of the plurality of conductive structures has a landing portion that overlies the first dielectric layer and further has a plurality of conductive columns that extend from the landing portion to different electrodes of the plurality of electrodes, and wherein the plurality of conductive columns decrease continuously in width from the landing portion to the plurality of electrodes;
- performing a circuit probe test for the integrated circuit structure via the plurality of conductive structures; and
- removing the first dielectric layer and the plurality of conductive structures to expose the plurality of electrodes.

10. The method of claim 9, wherein the landing portion and the plurality of conductive columns correspond to different portions of the conductive layer.

11. The method of claim 9, wherein the plurality of conductive columns share a common cross-sectional profile with a height corresponding to a separation between the landing portion and the plurality of electrodes.

12. The method of claim 9, wherein the plurality of conductive columns directly and physically contact the different electrodes of the plurality of electrodes, and wherein there is a one-to-one correspondence between the plurality of conductive columns and the different electrodes of the plurality of electrodes.

13. The method of claim 9, further comprising:
- forming a first protective film over the dielectric structure and the plurality of electrodes before the forming of the first dielectric layer, wherein the etching of the first dielectric layer further comprises etching at least a portion of the first protective film over the plurality of electrodes, and wherein the removing of the first dielectric layer and the plurality of conductive structures further exposes the first protective film after the removing of the at least a portion of the conductive layer.

14. The method of claim 13, further comprising:
- forming a second protective film over the first protective film and the plurality of electrodes after the removing of the first dielectric layer and the plurality of conductive structures.

15. The method of claim 13, wherein the etching of the first dielectric layer forms a plurality of openings exposing the different electrodes of the plurality of electrodes, and wherein the conductive layer is formed filling the plurality of openings.

16. A method, comprising:
- providing an integrated circuit structure comprising:
  - a substrate;
  - a dielectric structure disposed over the substrate, the dielectric structure comprising an upper surface and including a conductive interconnection structure; and
  - a plurality of electrodes disposed over the upper surface of the dielectric structure, and wherein at least one of the substrate and the dielectric structure includes at least one electronic circuit coupled to the plurality of electrodes by way of the conductive interconnection structure;
- forming a first dielectric layer over the dielectric structure and the plurality of electrodes;
- etching the first dielectric layer over each of the plurality of electrodes to form a plurality of openings concurrently and respectively exposing the plurality of electrodes;
- forming a conductive layer over the first dielectric layer and the plurality of electrodes and further filling the plurality of openings;
- removing at least a portion of the conductive layer to form a plurality of conductive structures from the conductive layer, wherein a first conductive structure of the plurality of conductive structures overlies the first dielectric layer and extends through the first dielectric layer to two or more of the plurality of electrodes;

performing a circuit probe test for the integrated circuit structure via the plurality of conductive structures; and removing the plurality of conductive structures to expose the plurality of electrodes after the removing of the at least a portion of the conductive layer.

17. The method of claim 16, wherein the plurality of electrodes have individual widths that decrease monotonically towards the substrate and have individual top surfaces at a common elevation above the substrate.

18. The method of claim 16, wherein the conductive layer has a first thickness overlying the plurality of electrodes and a second thickness overlying the first dielectric layer, wherein the second thickness is less than the first thickness, and wherein the first conductive structure has the first and second thicknesses.

19. The method of claim 16, wherein the first conductive structure has a plurality of protrusions, each protrusion of the plurality of protrusions extending to a corresponding electrode of the two or more of the plurality of electrodes and through an entire thickness of the first dielectric layer.

20. The method of claim 16, further comprising:

forming a first protective film over the dielectric structure and the plurality of electrodes before the forming of the first dielectric layer, wherein the etching of the first dielectric layer further comprises etching at least a portion of the first protective film over the plurality of electrodes, and wherein the removing of the plurality of conductive structures further exposes the first protective film after the removing of the at least a portion of the conductive layer.

* * * * *